(12) United States Patent
Qureshi

(10) Patent No.: US 6,289,480 B1
(45) Date of Patent: *Sep. 11, 2001

(54) CIRCUITRY FOR HANDLING HIGH IMPEDANCE BUSSES IN A SCAN IMPLEMENTATION

(75) Inventor: Fazal Ur Rehman Qureshi, San Jose, CA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/065,742

(22) Filed: Apr. 24, 1998

(51) Int. Cl.$^7$ ................................................. G01R 31/28
(52) U.S. Cl. ........................................ 714/726; 326/16
(58) Field of Search .......................... 714/726, 727, 714/729, 725; 326/16

(56) References Cited

U.S. PATENT DOCUMENTS

| | | | |
|---|---|---|---|
| 4,703,484 | * 10/1987 | Rolfe et al. | 714/726 |
| 5,852,617 | * 12/1998 | Mote, Jr. | 714/726 |
| 5,909,452 | * 6/1999 | Angelotti | 714/726 |
| 5,983,376 | * 11/1999 | Narayanan | 714/726 |

OTHER PUBLICATIONS

Angelotti et al.(System Level Interconnect Test in a Tristate Environment.IEEE, Oct. 1993).*

\* cited by examiner

*Primary Examiner*—Christine T. Tu
*Assistant Examiner*—Guy Lamarre
(74) *Attorney, Agent, or Firm*—Stallman & Pollock LLP

(57) ABSTRACT

An integrated circuit implemented utilizing scan design for test techniques includes a plurality of bus driver circuits. Each bus driver circuit has a driver output connected to a bus to provide an associated driver output signal to the bus. Each bus driver circuit also includes a high impedance control node such that an input control signal having a first logic state applied to the control node enables the bus driver circuit to provide an associated driver output signal having either a high logic state or a low logic state. An input control signal having a second logic state applied to the control node causes the bus driver circuit to provide an associated driver output signal that has a high impedance state. The circuit also includes a plurality of scan registers coupled as a scan chain such that the scan chain responds to a scan test enable signal having the second logic state by initiating a scan-in operation in which test data is sequentially shifted into the scan registers in the scan chain. Each one of the scan registers has an output coupled to a data input of a corresponding one of the bus driver circuits. High impedance control circuitry responds to the scan test enable signal having the second logic state by applying an input control signal having the second logic state to the control node of each of the plurality bus driver circuits. Thus, the bus is held in a high impedance state during the scan operation.

5 Claims, 2 Drawing Sheets

CIRCUITRY FOR HANDLING HIGH IMPEDANCE BUSSES IN A SCAN IMPLEMENTATION

BACKGROUND OF THE INVENTION

1. Field of the Invention

The present invention relates to scan design for test (DFT) and, in particular, to circuitry and methods for handling high impedance conditions in integrated circuits when implementing scan DFT.

2. Discussion of the Related Art

"Testability" is an integrated circuit device design characteristic that influences various costs associated with testing the device. Usually, testability allows for determination of the status of a device, quick isolation of faults within the device, and cost-effective development of the tests themselves to determine device status.

"Design for Test" (DFT) techniques are design efforts specifically employed to ensure that a device is testable.

Two important attributes related to device testability are "controllability" and "observability." "Controllabilty" is the ability to establish a specific signal value at each node in a circuit by setting values on the circuit's inputs. "Observability" is the ability to determine the signal value at a node in a circuit by controlling the circuit's inputs and observing its outputs.

One of the most popular DFT techniques is referred to as scan design since it utilizes scan registers. A scan register is a register with both shift and parallel-load capability. The storage cells in a scan register are used as test control and/or observation points.

FIG. 1 shows a conventional scan storage cell (SSC) register chain. When TE=0 (normal mode), data are loaded into the individual scan storage cell registers 10 in parallel from associated data input lines D based upon clock signal CK. When TE=1 (test mode), data are loaded serially into the scan chain from a test line Si based upon clock signal CK. Thus, a scan register shifts test data when TE=1 and loads normal data in parallel when TE=0. Loading test data into a scan register chain when TE=1 is referred to as a scan-in operation. Reading data out of a scan register chain is referred to as a scan-out operation.

One problem associated with scan DFT is that it limits circuit designers to a very restrictive design style to the exclusion of other design practices, styles and techniques. One such restriction is a strict prohibition on the use of high impedance busses in the circuit.

However, for a variety of reasons, it is strategically desirable for integrated circuit designers to have the capability to include high impedance conditions on their devices, since it is an important design tool that is extremely useful and is widely used. The problem arises because, when test data is being shifted into a scan chain, the situation could arise in which multiple drivers 14 are attempting to drive a bus 16, as shown in FIG. 1, with clear undesirable consequences.

Therefore, it would be desirable to have available a scan design for test technique that enables the use of high impedance busses in the circuit design.

SUMMARY OF THE INVENTION

The present invention provides circuitry and methods for handling high impedance busses in a scan implementation by preventing all control signals to bus driver circuits from getting through to the drivers during a scan operation.

Thus, in accordance with the concepts of the present invention, an integrated circuit includes a plurality of bus driver circuits. Each bus driver circuit has a driver output connected to a bus to provide an associated driver output signal to the bus. Each bus driver circuit also includes a high impedance control node. An input control signal having the first logic state applied to the control node enables the bus driver circuit to provide an associated driver output signal having either a high logic state or a low logic state. An input control signal having a second logic state applied to the control node causes the bus driver circuit to provide an associated driver output signal having a high impedance state. The integrated circuit also includes a plurality of scan registers connected as part of a scan chain. The scan chain responds to a scan test enable signal having the second logic state by initiating a scan-in operation in which test data is sequentially shifted into the scan chain. Each one of the scan registers has an output coupled to a data input of a corresponding one of the bus driver circuits. High impedance control circuitry responds to the second logic state of the scan test enable signal by applying an input control signal having the second logic state to the control node of each of the plurality of bus driver circuits. Thus, during a scan operation, the bus is held in a high impedance state.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
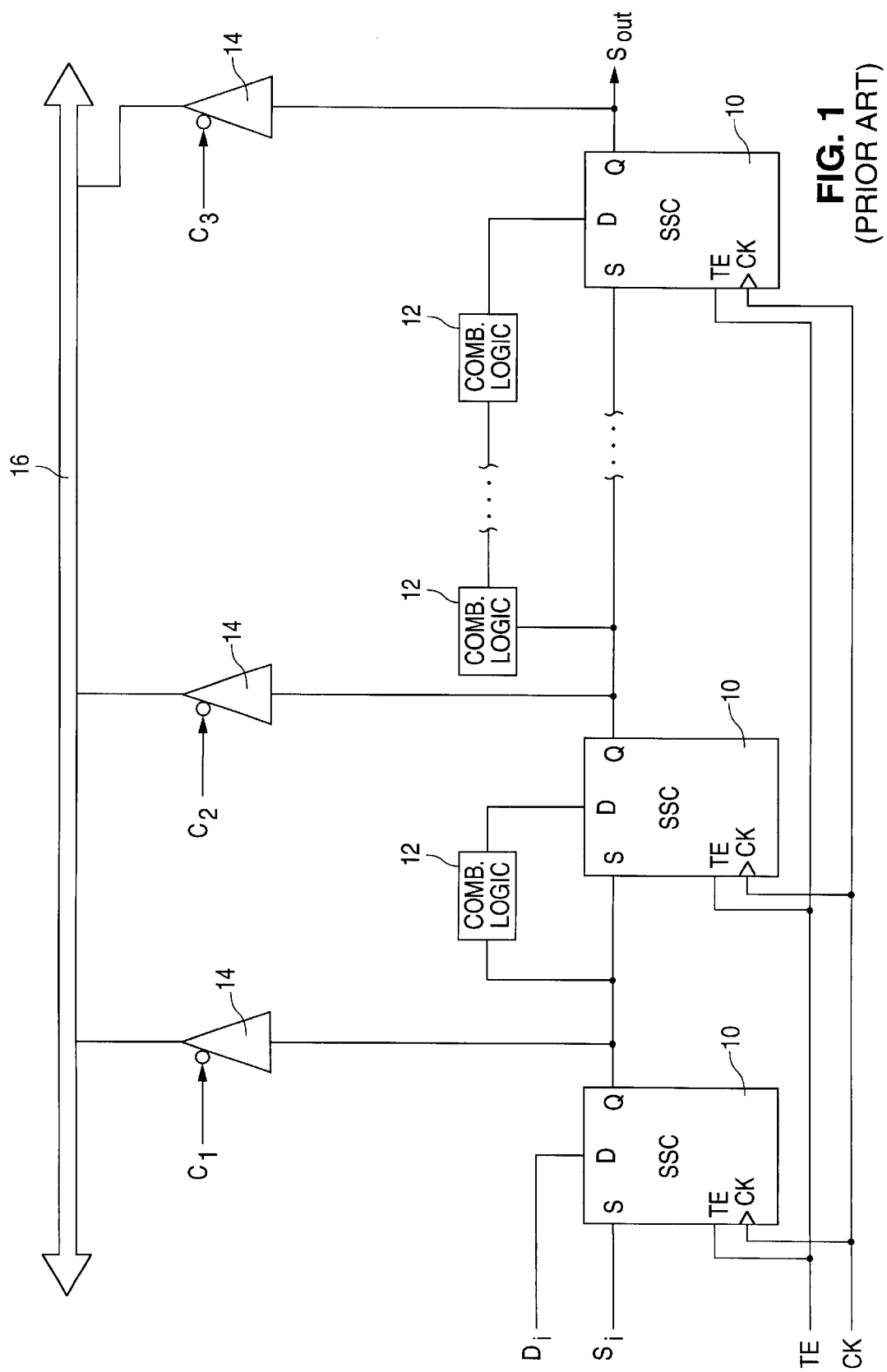
FIG. 1 is a block diagram illustrating a conventional scan register chain.
Figure 2:
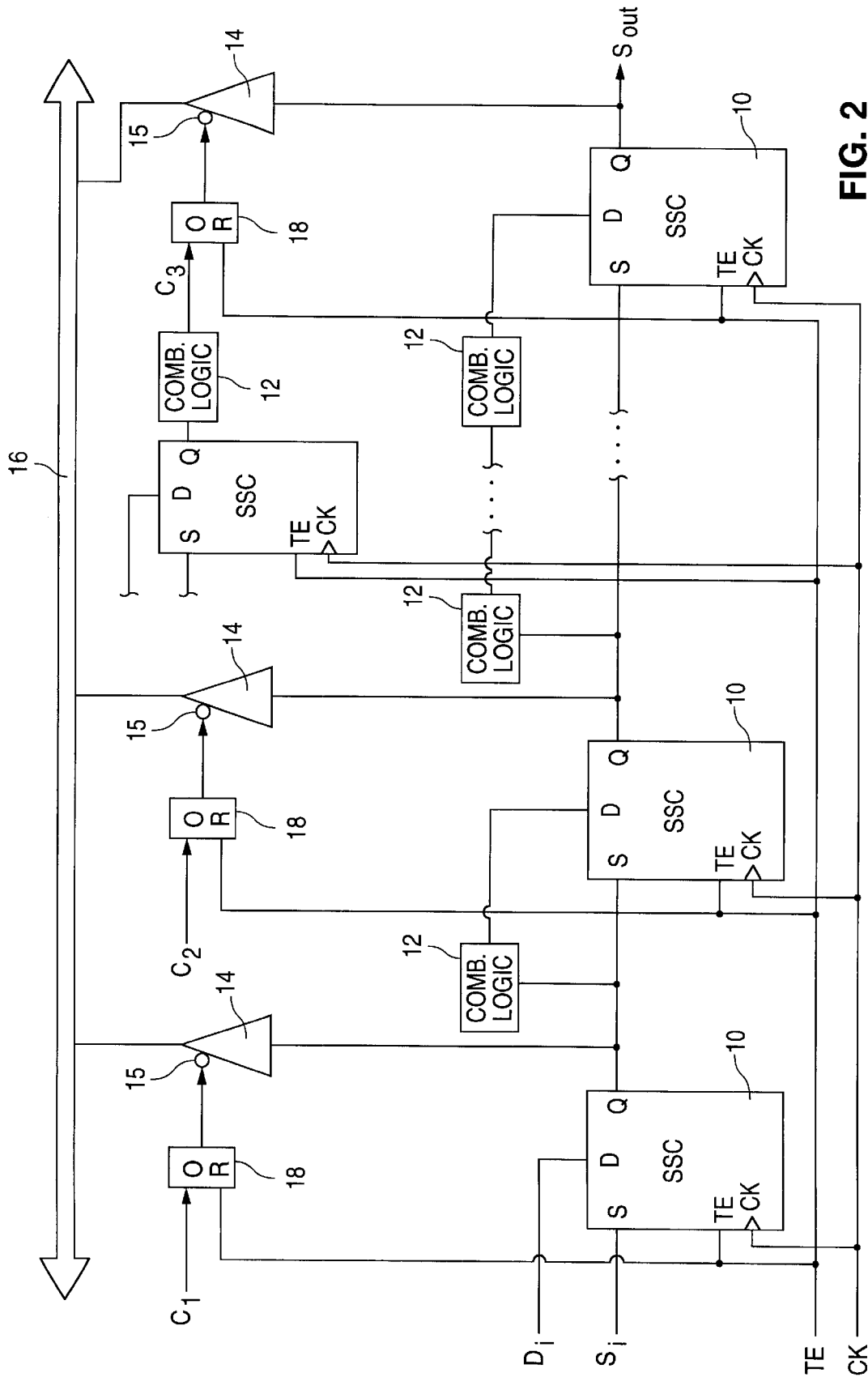
FIG. 2 is a block diagram illustrating a scan register chain and associated circuitry for allowing the use of high impedance busses in scan DFT circuit design in accordance with the concepts of the present invention.

As discussed above, normal control and observability requirements for scan design for test (DFT) have become a special challenge when dealing with high impedance busses within the context of scan implementation. Referring to FIG. 2, the scan implementation requirements are that (1) all scan storage cells are scan flip-flops 10 that are connected in scan chains and (2) the high impedance control signals C1–C3 can come from scan storage cells either directly or indirectly by first going through combinatorial logic, as shown for example for control signal C3.

In accordance with the present invention, the test enable signal TE which initiates a scan operation (TE=1) within the integrated circuit prevents all control signals C1–C3 from getting through to the bus driver circuits 14 while a scan shift operation is in progress, placing each bus driver circuit 14 in a high impedance output state. Thus, the bus 16 to which the bus driver circuits 14 are connected is maintained in a high impedance state during the scan operation.

More specifically, with continuing reference to FIG. 2, an integrated circuit that provides a high impedance bus in a scan design for test implementation, in accordance with the invention, includes a bus 16. The circuit also includes a plurality of bus driver circuits 14. Each bus driver circuit 14 includes a driver output connected to the bus 16 to provide an associated driver output signal to the bus 16. Each bus driver circuit 14 also includes a high impedance control node 15. An input control signal having a first logic state ("0") applied to the control node 15 enables the bus driver circuit 14 to provide an associated driver output signal having either a high logic state ("1") or a low logic state ("0") to the bus 16. An input control signal having a second logic state ("1") applied to the control node 15 causes the bus driver circuit 14 to provide an associated driver output signal having only a high impedance state to the bus 16.

FIG. 2 also shows a plurality of scan registers 10 coupled as part of a scan chain. The scan chain responds in a conventional manner to a scan test enable signal TE having a second logic state (TE=1) by initiating a scan operation in which test data is sequentially shifted into the scan registers in the chain. As show in FIG. 2, each one of the scan registers 10 has an output coupled to a data input of a corresponding one of the bus driver circuits 14.

FIG. 2. also shows high impedance control circuitry 18, which in the illustrated embodiment comprises an individual OR gate, associated with each one of the control signals C1–C3. Thus, when the test enable signal TE is logic high, the OR gate 18 applies a logic high signal to the high impedance control node of each bus driver circuit 14, thereby forcing the output of that circuit into a high impedance state. Those skilled in the art will appreciate that the OR gate implementation is intended to be illustrative, not limiting, and that other logic circuitry can be utilized to perform the same function.

Those skilled in the art will also appreciate that if the high impedance enable control pins of the bus driver circuit 14 were primary inputs, then there is no need for the control signal bypass arrangement and the problem would not exist.

Those skilled in the art will further appreciate that the automatic test program (ATPG) tool has to be able to ensure that control signal C1–C3 are produced on a mutually exclusively basis. If this cannot be guaranteed, than additional features will have to be added to this circuit to ensure successful operation in the normal, non-high-impedance state (TE=0).

It should be understood that various alternatives to the embodiments of the invention described herein may be employed in practicing the invention. It is intended that the following claims define the scope of the invention and that circuits within the scope of these claims and their equivalents be covered thereby.

What is claimed is:

1. An integrated circuit comprising:

a bus;

a plurality of bus driver circuits, each bus driver circuit having a driver output connected to the bus to provide an associated driver output signal to the bus, each bus driver circuit further having a high impedance control node such that an input control signal having a first logic state applied to the control node enables said bus driver circuit to provide an associated driver output signal having either a high logic state or a low logic state, and such that an input control having a second logic state applied to said control node causes said bus driver circuit to provide an associated driver output signal having a high impedance state;

a plurality of scan registers coupled as part of a scan chain such that each of the scan registers in the scan chain responds to a scan test enable signal having the second logic state by initiating a scan-in operation in which test data is sequentially shifted through the scan registers of the scan chain, each one of the scan registers having an output coupled to a scan input of a subsequent scan register in the scan chain and to a data input of a corresponding one of the bus driver circuits; and high impedance control circuitry that responds to the scan test enable signal having the second logic state by applying an input control signal having the second logic state to the control node of each of said plurality of bus driver circuits, thereby causing each bus driver circuit to provide the high impedance driver output signal to the bus.

2. An integrated circuit of claim 1, and wherein the high impedance control circuitry comprises OR gate circuitry.

3. The integrated circuit of claim 1, and wherein the input control signal applied to the control node of at least one of the plurality of bus driver circuits is generated by combinatorial logic formed as part of the integrated circuit.

4. An integrated circuit comprising:

a bus;

a plurality of bus driver circuits, each bus driver circuit having a driver output connected to the bus to provide an associated driver output signal to the bus, each bus driver circuit further having a high impedance,control node such that an input control signal having a low logic state applied to the control node enables said bus driver circuit to provide an associated driver output signal having either a high logic state or a low logic state, and such that an input control signal having a high logic state applied to said control node causes said bus driver circuit to provide an associated driver output signal having a high impedance state;

a plurality of scan registers coupled as part of a scan chain such that each of the scan registers in the scan chain responds to a scan test enable signal having the high logic state by initiating a scan-in operation in which test data is sequentially shifted through the scan registers of the scan chain, each one of the scan registers having an output coupled to a scan input of a subsequent scan register in the scan chain and to a data input of a corresponding one of the bus driver circuits; and for each bus driver circuit, control circuitry that responds to the scan test enable signal having the high logic state by applying an input control signal having the second logic state to the control node of each of said plurality of bus driver circuits, thereby causing each bus driver circuit to provide the high impedance driver output signed to the bus.

5. The integrated circuit of claim 4, and wherein the control circuitry comprises an or gate connected to receive the scan test enable signal as an input.

* * * * *